United States Patent
Liang et al.

(10) Patent No.: US 10,062,651 B2
(45) Date of Patent: Aug. 28, 2018

(54) PACKAGING SUBSTRATE AND ELECTRONIC PACKAGE HAVING THE SAME

(71) Applicant: Siliconware Precision Industries Co., Ltd., Taichung (TW)

(72) Inventors: Fang-Yu Liang, Taichung (TW); Hung-Hsien Chang, Taichung (TW); Yi-Che Lai, Taichung (TW); Chang-Fu Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/063,592

(22) Filed: Mar. 8, 2016

(65) Prior Publication Data

US 2017/0186702 A1      Jun. 29, 2017

(30) Foreign Application Priority Data

Dec. 28, 2015   (TW) .............................. 104144006 A

(51) Int. Cl.

| | |
|---|---|
| *H01L 23/00* | (2006.01) |
| *H01L 23/31* | (2006.01) |
| *H01L 23/522* | (2006.01) |
| *H01L 23/16* | (2006.01) |
| *H01L 21/48* | (2006.01) |
| *H01L 23/14* | (2006.01) |

(Continued)

(52) U.S. Cl.
CPC .......... *H01L 23/562* (2013.01); *H01L 21/486* (2013.01); *H01L 23/16* (2013.01); *H01L 23/49827* (2013.01); *H01L 23/145* (2013.01); *H01L 23/147* (2013.01); *H01L 23/15* (2013.01); *H01L 23/3128* (2013.01); *H01L 23/49816* (2013.01); *H01L 24/13* (2013.01); *H01L 24/16* (2013.01); *H01L 2224/0401* (2013.01); *H01L 2224/131* (2013.01); *H01L 2224/16238* (2013.01); *H01L 2924/157* (2013.01); *H01L 2924/15311* (2013.01); *H01L 2924/15787* (2013.01); *H01L 2924/15788* (2013.01); *H01L 2924/19041* (2013.01); *H01L 2924/19042* (2013.01); *H01L 2924/19043* (2013.01); *H01L 2924/19105* (2013.01); *H01L 2924/3511* (2013.01); *H01L 2924/3512* (2013.01); *H01L 2924/35121* (2013.01); *H01L 2924/37001* (2013.01)

(58) Field of Classification Search
CPC ....................................................... H01L 23/56
See application file for complete search history.

(56) References Cited

U.S. PATENT DOCUMENTS

| 2014/0048926 A1* | 2/2014 | Wang ...................... H01L 24/13 257/737 |
| 2014/0252603 A1* | 9/2014 | Lee ....................... H01L 23/481 257/737 |

(Continued)

*Primary Examiner* — Mounir Amer
(74) *Attorney, Agent, or Firm* — Mintz Levin Cohn Ferris Glovsky and Popeo, P.C.; Peter F. Corless; Steven M. Jensen

(57) ABSTRACT

A packaging substrate is provided, which includes: a substrate body having a first region with a plurality of conductive pads and a second region adjacent to the first region, and a material layer formed on the second region to prevent the substrate body from warping. An electronic package having the packaging substrate is also provided.

20 Claims, 7 Drawing Sheets

(51) Int. Cl.
H01L 23/15 (2006.01)
H01L 23/498 (2006.01)

(56) References Cited

U.S. PATENT DOCUMENTS

2016/0133591 A1* 5/2016 Hong ...................... H01L 24/11
 257/737
2016/0351472 A1* 12/2016 Park ...................... H01L 23/481
2017/0271299 A1* 9/2017 Li ........................... H01L 24/83

* cited by examiner

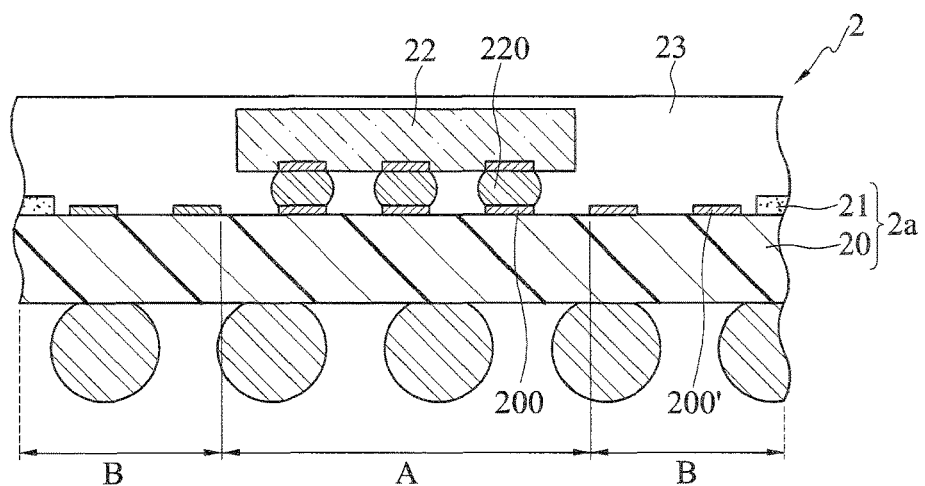
FIG.2A
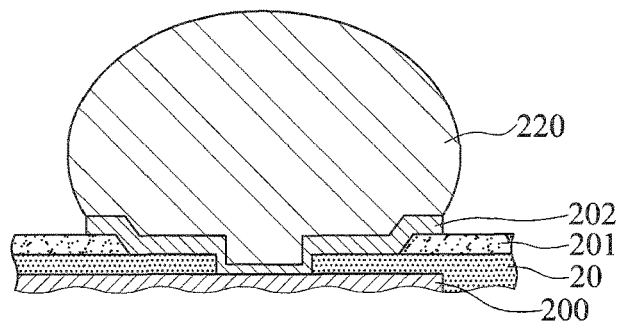
FIG.2A'
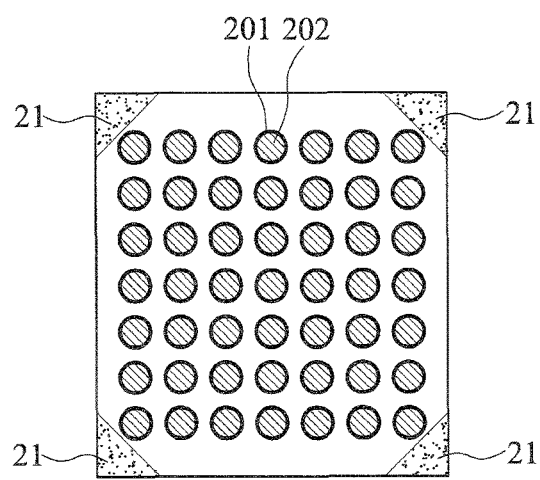
FIG.2A"

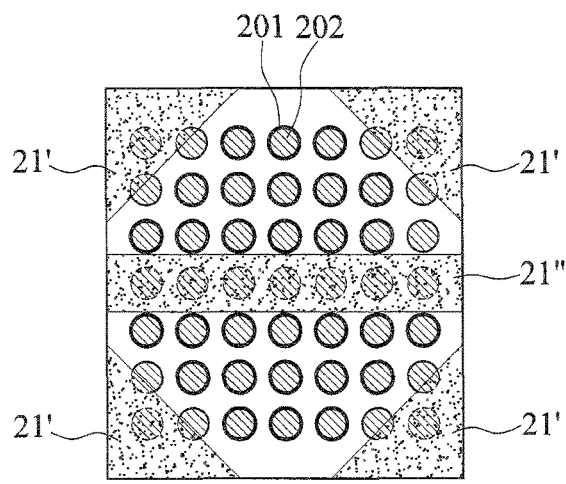
FIG.2B
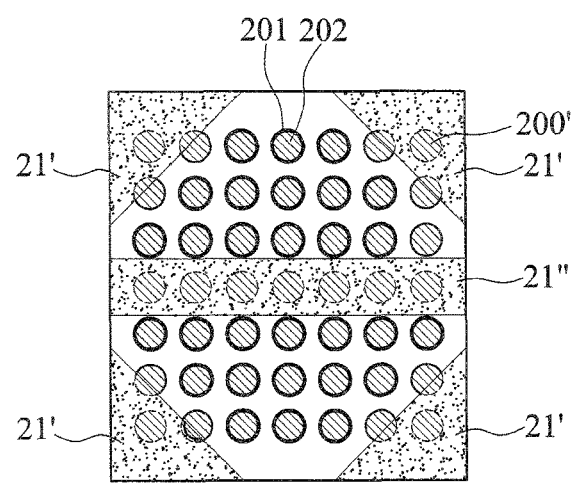
FIG.2B'
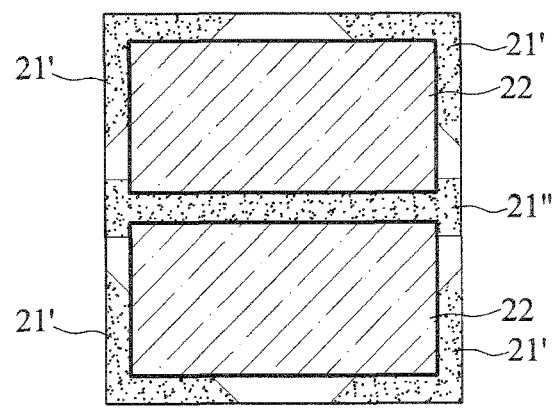
FIG.2B"

PACKAGING SUBSTRATE AND ELECTRONIC PACKAGE HAVING THE SAME

CROSS-REFERENCE TO RELATED APPLICATION

This application claims under 35 U.S.C. § 119(a) the benefit of Taiwanese Patent Application No. 104144006 filed Dec. 28, 2015, the entire contents of which are incorporated herein by reference.

BACKGROUND

1. Technical Field

The present disclosure relates to package structures, and, more particularly, to a substrate and an electronic package having the same.

2. Description of Related Art

Along with the rapid development of electronic industries, many high-end electronic products are developed toward the trend of high integration. Accordingly, various chip packaging technologies are developed and chip packaging sizes are continuously reduced to meet the miniaturization requirement of semiconductor packages.

FIG. 1 is a schematic cross-sectional view of a conventional package structure 1. The package structure 1 has a packaging substrate 10, a semiconductor chip 12 disposed on the packaging substrate 10 in a flip-chip manner, and an encapsulant 13 encapsulating the semiconductor chip 12.

Referring to FIGS. 1 and 1', the packaging substrate 10 has a plurality of conductive pads 100, a passivation layer 101 is formed around the conductive pads 100, and an under bump metallurgy (UBM) layer 102 is formed on the conductive pads 100.

The semiconductor chip 12 is bonded to the UBM layer 102 of the conductive pads 100 through a plurality of solder bumps 11.

However, referring to FIGS. 1A and 1A', during fabrication of the package structure 1, the packaging substrate 10 has a full-panel size (i.e., a size for mass-production), and stress concentration regions K (for example, at corners of the packaging substrate 10) are likely formed at a periphery of the semiconductor chip 12. Referring to FIG. 1A', a region closer to the corner has more stress concentration (indicated by the density of points in FIG. 1A') induced. Therefore, when temperature cycling or stress variation occurs in a reflow process or a drop test, the packaging substrate 10 likely warps due to a coefficient of thermal expansion (CTE) mismatch between the packaging substrate 10 and the semiconductor chip 12 (or the encapsulant 13). Consequently, solder balls 14 disposed on a lower side of the packaging substrate 10 are likely delaminated from the packaging substrate 10, and problems such as non-wetting of the solder balls 14 and cracking of the packaging substrate 10 likely occur.

Further, warpage of the packaging substrate 10 likely causes cracking of the semiconductor chip 12, and, as such, the product yield is reduced.

Therefore, how to overcome the above-described drawbacks has become critical.

SUMMARY

In view of the above-described drawbacks, the present disclosure provides a substrate for use in a packaging process. The packaging substrate comprises: a substrate body having a first region with a plurality of conductive pads and a second region adjacent to the first region; and a material layer formed on the second region to prevent the substrate body from warping.

The present disclosure further provides an electronic package, which comprises: a substrate body having a first region with a plurality of conductive pads and a second region adjacent to the first region; a material layer formed on the second region to prevent the substrate body from warping; and an electronic element bonded to the conductive pads.

In an embodiment, the substrate body can be made of a semiconductor material, a ceramic material or an organic material.

In an embodiment, a plurality of conductive vias are formed in the substrate body and electrically connected to the conductive pads.

In an embodiment, the second region is positioned at a corner of the substrate body.

In an embodiment, the material layer is further formed on the first region to divide the first region into at least two blocks.

In an embodiment, the region where the material layer is formed is a stress concentration region of the packaging substrate.

In an embodiment, a passivation layer is formed around the conductive pads. In still an embodiment, the passivation layer and the material layer can be made of the same material.

In an embodiment, an under bump metallurgy (UBM) layer is formed on the conductive pads.

In an embodiment, the conductive pads are further disposed on the second region. In still an embodiment, the conductive pads disposed on the second region are exposed from or embedded in the material layer.

According to the present disclosure, the material layer is formed on the substrate body at a periphery of the predefined region for disposing the electronic element, such that the substrate body can be prevented from warping during a packaging process. As such, the present disclosure overcomes the conventional problems that the solder balls are delaminated from the substrate body and the substrate body is cracked.

Further, by preventing the substrate body from warping, the present disclosure avoids cracking of the electronic element and hence increases the product yield.

BRIEF DESCRIPTION OF DRAWINGS

FIG. 1' is a schematic partially enlarged view of FIG. 1;

FIG. 1A' is a schematic diagram of stress distribution of the package structure of FIG. 1A;

FIG. 2A is a schematic cross-sectional view of an electronic package according to a first embodiment of the present disclosure;

FIG. 2A' is a schematic partially enlarged view of FIG. 2A;

FIG. 2A" is a schematic upper view of FIG. 2A;

FIG. 2B is a schematic upper view showing another embodiment of FIG. 2A";

FIG. 2B' is a schematic upper view showing another embodiment of FIG. 2B;

FIG. 2B" is a schematic upper view showing another embodiment of FIG. 2A;

FIG. 3B' is a schematic cross-sectional view showing another embodiment of FIG. 3B.

DETAILED DESCRIPTION OF PREFERRED EMBODIMENTS

Figure 1:
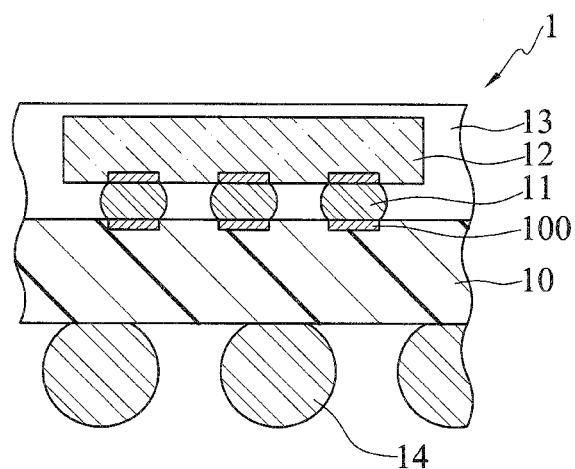
FIG. 1 is a schematic cross-sectional view of a conventional electronic package.
Figure 1:
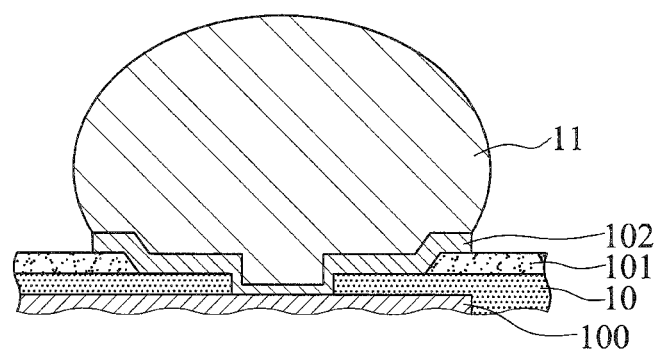
Figure 1A:
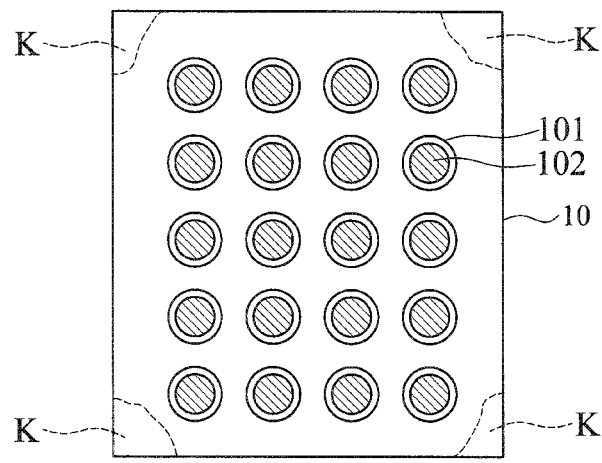
FIG. 1A is a schematic upper view of FIG. 1.
Figure 1A:
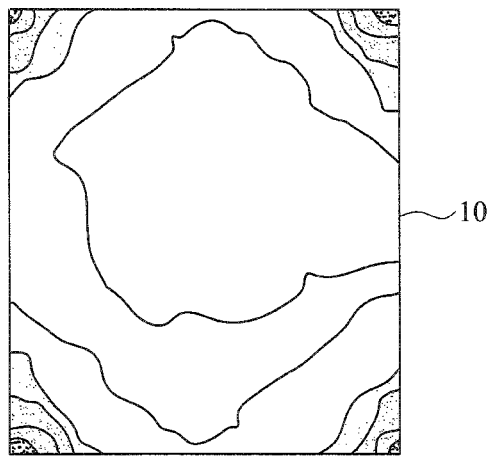

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

FIGS. 2A, 2A', 2A", 2B, 2B' and 2B" are schematic views of an electronic package 2 according to a first embodiment of the present disclosure.

Referring to FIG. 2A, the electronic package 2 has a substrate 2a used for a packaging process, an electronic element 22 bonded to the substrate 2a, and an encapsulant 23 encapsulating the electronic element 22. The substrate 2a has a substrate body 20 and a material layer 21 formed on the substrate body 20.

The substrate body 20 has a first region A having a plurality of first conductive pads 200, and a plurality of second regions B positioned at a periphery of the first region A and having a plurality of second conductive pads 200'.

In an embodiment, the substrate body 20 is a ceramic board, an insulating board, a metal board or an organic board.

Further, a passivation layer 201 is formed around the first conductive pads 200, and a UBM layer 202 is formed on the first conductive pads 200.

Furthermore, referring to FIG. 2A", the second regions B are positioned at corners of the substrate body 20.

The material layer 21 is formed on the second regions B.

In an embodiment, the material layer 21 is made of silicon oxide or silicon nitride, and the second conductive pads 200' are exposed from the material layer 21.

Further, the material layer 21 and the passivation layer 201 can be made of the same material. For example, the passivation layer 201 is made of polyimide, benzocyclobutene (BCB), polybenzoxazole (PBO), epoxy resin or polymer. The material layer 21 and the passivation layer 201 can be fabricated simultaneously to save time.

The regions where the material layer 21 is formed are stress concentration regions of the substrate 2a.

The electronic element 22 is bonded to the UBM layer 202 of the first conductive pads 200 through a plurality of conductive elements 220.

The conductive elements 220 can include a solder material, or can be copper bumps. The electronic element 21 can be an active element such as a semiconductor chip, a passive element such as a resistor, a capacitor or an inductor, or a combination thereof.

In an embodiment, the second conductive pads 200' of the second regions B are covered by the material layer 21', as shown in FIG. 2B. In another embodiment, the second conductive pads 200' are exposed from the material layer 21' according to the practical need, as shown in FIG. 2B'. As such, the electronic element 22 can be disposed to cover the second regions B and electrically connected to the conductive pads 200'.

Further, referring to FIG. 2B", a plurality of electronic elements 22 can be disposed on the substrate 2a according to the practical need. In particular, before disposing of the electronic elements 22, the material layer 21" is further formed on the first region A so as to divide the first region A into two blocks (as shown in FIG. 2B) and the electronic elements 22 are disposed on the blocks, respectively. As such, the regions where the material layer 21', 21" is formed are stress concentration regions of the substrate 2a.

Referring to FIG. 2A, the electronic element 22 can further be bonded to the second conductive pads 200' through a plurality of conductive elements 220.

The encapsulant 23 is made of a molding compound such as an epoxy resin or a dielectric material.

In an embodiment, the material layer 21, 21', 21" is formed at a periphery of one die mounting region of FIG. 2A" for disposing the electronic element 22 or at peripheries of two die mounting regions of FIG. 2B". That is, the material layer 21, 21', 21" is formed on stress concentration regions of the substrate 2a so as to overcome the conventional problems such as warping or cracking of the substrate body 20 and delamination of solder balls during a packaging process. In particular, when temperature cycling or stress variation occurs to the substrate body 20 in a reflow process or a drop test, the substrate body 20 will not warp due to a CTE mismatch between the substrate body 20 and the electronic element 22 (or the encapsulant 23).

Further, by preventing the substrate body 20 from warping, the present disclosure prevents cracking of the electronic element 22 and hence increases the product yield.

Furthermore, the material layer 21, 21', 21" protects the substrate body 20 against cracking during a drop test or in other stress concentration circumstances.

In an embodiment, the material layer 21, 21', 21" (or the passivation layer 201) does not cover the entire surface of the substrate body 20. In an embodiment in which the material layer (or the passivation layer) covers the entire surface of the substrate body 20, a lithography process may deviate, and a non-wetting problem may occur due to deviation of the passivation layer 201.

FIGS. 3A to 3E are schematic cross-sectional views showing a method for fabricating an electronic package 3 according to a second embodiment of the present disclosure. The second embodiment differs from the first embodiment in the structure of the substrate body 30'.

Figure 3A:
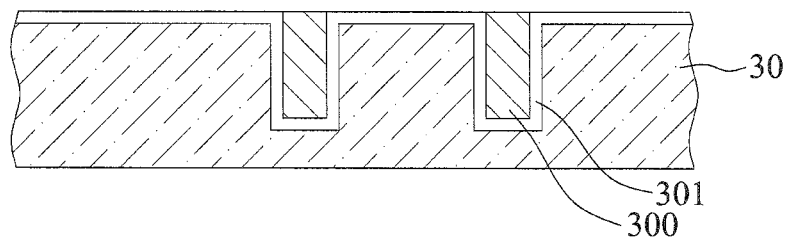
FIGS. 3A to 3E are schematic cross-sectional views showing a method for fabricating an electronic package according to a second embodiment of the present disclosure.

Referring to FIG. 3A, a carrier 30 is provided, and a plurality of conductive posts extending inwardly from a surface of the carrier 30 are formed to serve as conductive vias 300.

In an embodiment, the carrier 30 is made of a semiconductor material, such as silicon or glass, and the conductive posts are metal posts such as copper posts.

To fabricate the conductive vias 300, a plurality of vias are formed on the surface of the carrier 30, an insulating layer 301 is formed on the surface of the carrier 30 and walls of the vias, and then a conductive material such as copper is filled in the vias to form the conductive posts. Then, a planarization process is performed to cause upper end surfaces of the conductive posts to be flush with a surface of the insulating layer 301.

The conductive vias 300 can be fabricated, based on actual needs, by different processes which are not limited to the above.

Figure 3B:
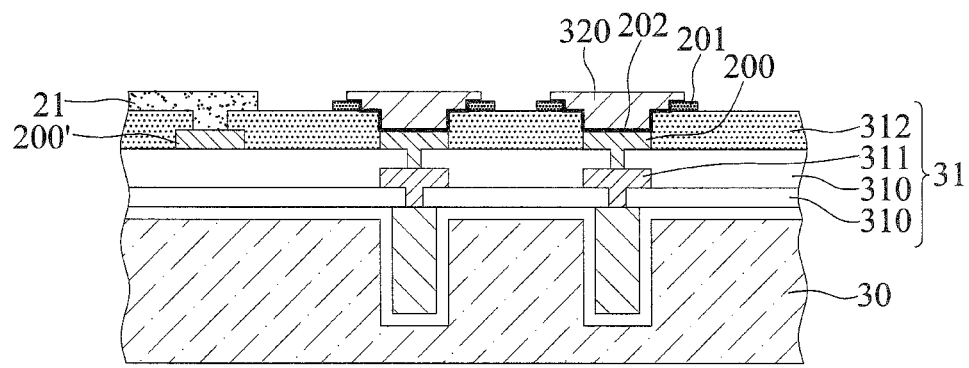
Figure 3B:
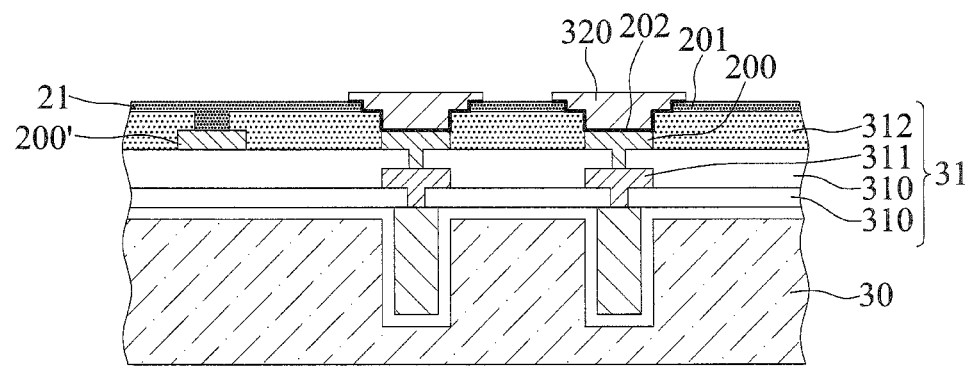

Referring to FIG. 3B, a circuit structure 31 is formed on the surface of the carrier 30.

In an embodiment, the circuit structure 31 has a plurality of dielectric layers 310, a plurality of circuit layers 311 formed on the dielectric layers 310, and an insulating layer 312 formed on the outermost dielectric layer 310.

The outermost circuit layer 311 has a plurality of first conductive pads 200 and second conductive pads 200' exposed from the insulating layer 312. A plurality of conductive elements 320 of a solder material or copper bumps are bonded to the first conductive pads 200, and a UBM layer 202 is optionally formed on the first conductive pads 200, so as to facilitate bonding of the conductive elements 320.

Further, a passivation layer 201 is formed around the first conductive pads 200, and a material layer 21 is formed on the insulating layer 312 at corners of the carrier 30.

In an embodiment, referring to FIG. 3B', the material layer 21 and the passivation layer 201 are made of the same material, and fabricated simultaneously to save time.

Figure 3C:
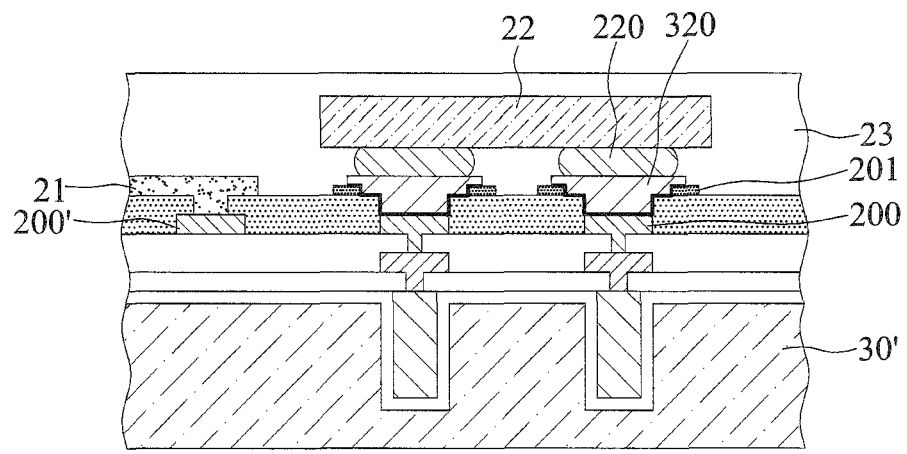

Referring to FIG. 3C, at least an electronic element 22 is disposed on and electrically connected to the first conductive pads 200 through conductive elements 220 and the conductive elements 320. Then, an encapsulant 23 is formed on the insulating layer 312 to encapsulate the electronic element 22.

Figure 3D:
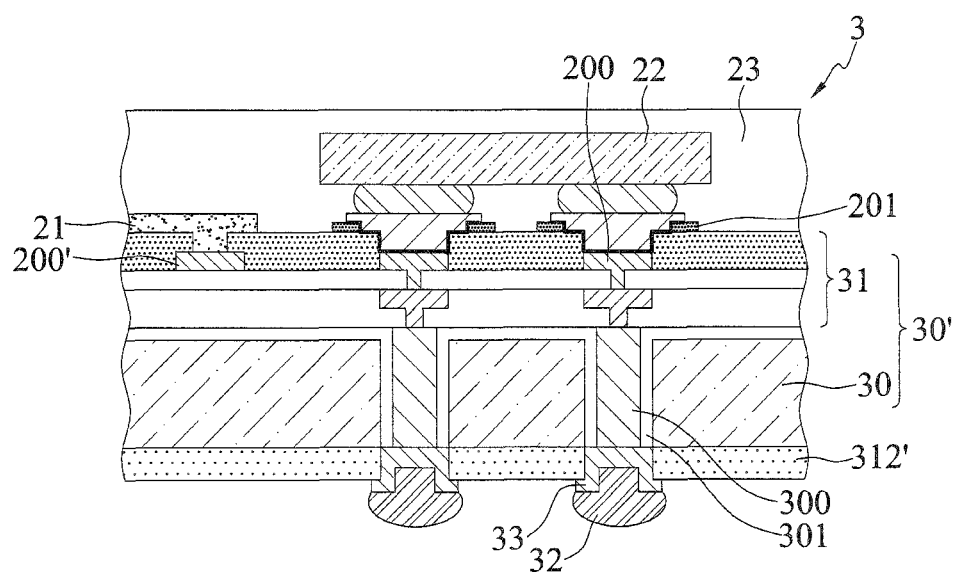

Referring to FIG. 3D, a portion of the carrier 30 is removed by grinding, to expose the insulating layer 301 and the conductive vias 300. As such, the carrier 30 serves as a silicon interposer, and the carrier 30 and the circuit structure 31 constitute a substrate body 30'.

Then, an insulating layer 312' is formed on a lower side of the substrate body 30', exposing lower end surfaces of the conductive vias 300. Thereafter, a plurality of conductive elements 32 are bonded to the lower end surfaces of the conductive vias 300 so as to be electrically connected to the conductive vias 300.

In an embodiment, the conductive elements 32 include a solder material, or are copper bumps, and a UBM layer 33 is optionally formed below the conductive elements 32.

Figure 3E:
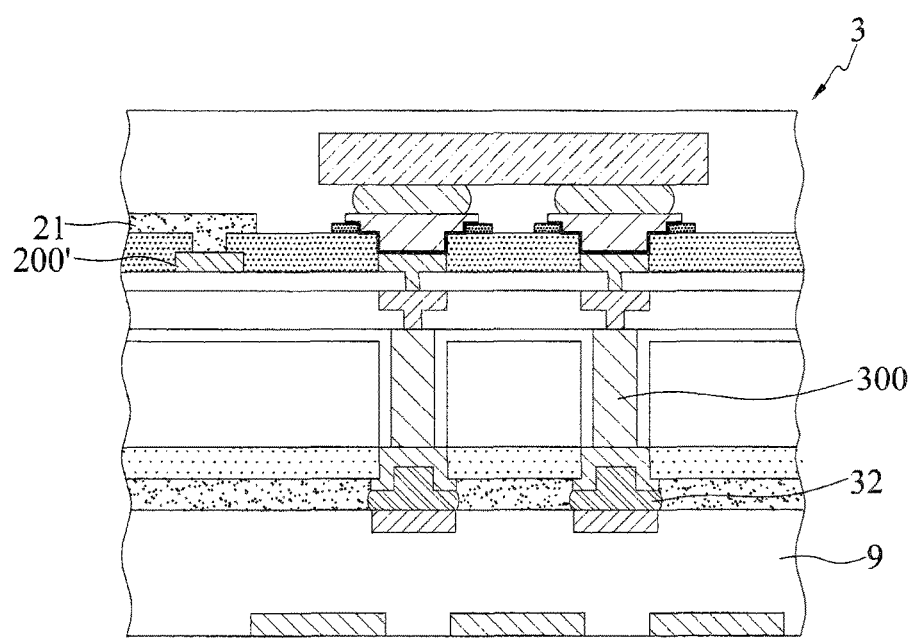

Referring to FIG. 3E, the electronic package 3 is disposed on a packaging substrate 9 through the conductive elements 32.

The material layer 21 of the electronic package 3 prevents the substrate body 30' from warping, thereby overcoming the conventional problems such as delamination of solder balls and cracking of the substrate body 30', and avoiding cracking of the electronic element 22 and hence increasing the product yield.

According to the present disclosure, a material layer is formed on a substrate body at a periphery of a die mounting region so as to prevent the substrate body from warping and avoid problems caused by warpage of the substrate body.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. A packaging substrate, comprising:
   a substrate body having a first region with a plurality of first conductive pads and a second region with a plurality of second conductive pads adjacent to the first region; and
   a material layer formed on and covering the second region to prevent the substrate body from warping, wherein one part of the second conductive pads is completely covered by the material layer, and another part of the second conductive pads is exposed from the material layer with a circumferential surface of the second conductive pads being in direct contact with the material layer.

2. The packaging substrate of claim 1, wherein the substrate body is made of a semiconductor material, a ceramic material or an organic material.

3. The packaging substrate of claim 1, further comprising a plurality of conductive vias formed in the substrate body and electrically connected to the first conductive pads.

4. The packaging substrate of claim 1, wherein the second region is positioned at a corner of the substrate body.

5. The packaging substrate of claim 1, wherein the second region with the material layer formed thereon is defined as a stress concentration region.

6. The packaging substrate of claim 1, wherein the material layer is further formed on the first region to divide the first region into at least two blocks.

7. The packaging substrate of claim 6, wherein the first region with the material layer formed thereon is defined as a stress concentration region.

8. The packaging substrate of claim 1, further comprising a passivation layer formed around the first conductive pads.

9. The packaging substrate of claim 8, wherein the passivation layer and the material layer are made of the same material.

10. The packaging substrate of claim 1, further comprising an under bump metallurgy layer formed on the first conductive pads.

11. An electronic package, comprising:
    a substrate body having a first region with a plurality of first conductive pads and a second region with a plurality of second conductive pads adjacent to the first region;
    a material layer formed on and covering the second region to prevent the substrate body from warping, wherein one part of the second conductive pads is completely covered by the material layer, and another part of the second conductive pads is exposed from the material layer with a circumferential surface of the second conductive pads being in direct contact with the material layer; and
    an electronic element bonded to the first conductive pads.

12. The electronic package of claim 11, wherein the substrate body is made of a semiconductor material, a ceramic material or an organic material.

13. The electronic package of claim 11, further comprising a plurality of conductive vias formed in the substrate body and electrically connected to the first conductive pads.

14. The electronic package of claim 11, wherein the second region is positioned at a corner of the substrate body.

15. The electronic package of claim 11, wherein the second region with the material layer formed thereon is defined as a stress concentration region.

16. The electronic package of claim 11, wherein the material layer is further formed on the first region to divide the first region into at least two blocks.

17. The electronic package of claim 16, wherein the first region with the material layer formed thereon is defined as a stress concentration region.

18. The electronic package of claim 11, further comprising a passivation layer formed around the first conductive pads.

19. The electronic package of claim 18, wherein the passivation layer and the material layer are made of the same material.

20. The electronic package of claim 11, further comprising an under bump metallurgy layer formed on the first conductive pads.

* * * * *